(12) United States Patent
Dutta

(10) Patent No.: US 8,875,002 B1
(45) Date of Patent: Oct. 28, 2014

(54) LOW COST ADJACENT DOUBLE ERROR CORRECTING CODE

(75) Inventor: Avijit Dutta, Tigard, OR (US)

(73) Assignee: Cypress Semiconductor Corporation, San Jose, CA (US)

( * ) Notice: Subject to any disclaimer, the term of this patent is extended or adjusted under 35 U.S.C. 154(b) by 64 days.

(21) Appl. No.: 13/535,541

(22) Filed: Jun. 28, 2012

Related U.S. Application Data

(60) Provisional application No. 61/588,843, filed on Jan. 20, 2012.

(51) Int. Cl.
| | | |
|---|---|---|
| *H03M 13/13* | (2006.01) | |
| *G06F 11/08* | (2006.01) | |
| *H03M 13/11* | (2006.01) | |
| *G06F 11/10* | (2006.01) | |

(52) U.S. Cl.
CPC ....... *H03M 13/1148* (2013.01); *G06F 11/1028* (2013.01)
USPC ...................................................... 714/781

(58) Field of Classification Search
CPC ............... G06F 11/1028; G06F 17/16; H03M 13/1148; H03M 13/1575
USPC ............................................................. 714/781
See application file for complete search history.

(56) References Cited

U.S. PATENT DOCUMENTS

| | | | |
|---|---|---|---|
| 4,168,486 | A | 9/1979 | Legory |
| 6,604,222 | B1 | 8/2003 | Jensen |
| 7,512,871 | B1 | 3/2009 | Carmichael |
| 7,576,557 | B1 | 8/2009 | Tseng |
| 7,852,107 | B1 | 12/2010 | Sundararajan |
| 8,516,339 | B1 * | 8/2013 | Lesea et al. .................. 714/763 |
| 2007/0162798 | A1 | 7/2007 | Das et al. |
| 2009/0249175 | A1 | 10/2009 | Chandra |

OTHER PUBLICATIONS

Boris Polianskikh and Zeljko Zilic, "Design and Implementation of Error Detection and Correction Circuitry for Multilevel Memory Protection", Proceedings of the 32nd IEEE International Symposium on Multiple-Valued Logic (ISMVL.02), 2002.
Costas Argyrides, Hamid R. Zarandi, Dhiraj K. Pradhan, "Matrix Codes: Multiple Bit Upsets Tolerant Method for SRAM Memories", 22nd IEEE International Symposium on Defect and Fault Tolerance in VLSI Systems, 2007.
Gustavo Neuberger, Fernanda de Lima, Luigi Carro, Ricardo Reis, "A Multiple Bit Upset Tolerant SRAM Memory", 2007.
[Abramson 59] Abramson N. M., "A Class of Systematic Codes for Non-Independent Errors", Proc. IEEE Trans. on Information Theory, vol. IT-5. pp. 150-157. Dec. 1959.

(Continued)

*Primary Examiner* — Albert Decady
*Assistant Examiner* — Christian Dorman

(57) ABSTRACT

A device includes a controller configured to provide a data word and check bits for the data word to decoding logic, the decoding logic configured to generate a decoding of the data word and check bits for the data word in conformance with an H-matrix having the following properties:
(a) no all 0 columns;
(b) all columns are distinct;
(c) no linear dependency involving three or less columns;
(d) no linear dependency involving columns $C_i$, $C_j$, $C_k$, $C_m$, where $m>k>j>i$, where $j=i+1$ and $m=k+1$; and
(e) no linear dependency involving columns $C_i$, $C_j$, $C_k$, $C_m$, where $m>k>j>i$, where ($j=i+1$ and $m-k=q$) or ($k=j+1$ and $m-i=q$) or ($m=k+1$ and $j-i=q$) for all integer values of q such that $q>1$ and $q<=d$, where $d>=2$ and $d<=n-1$ where $n-k$ is a number of the check bits.

20 Claims, 17 Drawing Sheets

(56) References Cited

OTHER PUBLICATIONS

[Berlekamp 68] Berlekamp. E. R., Algebraic Coding Theory, McGraw-Hill, New York. 1968.

[Bernstein 63] Bernstein. A.. and W. Kim,"Single and Double Adjacent Error-correcting codes for arithmetic Units", IEEE Trans on Information Theory, vol. 9. pp. 209-210. Mar. 1963.

[Bossen 70] Bossen, D. C.,"b-Adjacent Error Correction". IBM Journal of Research and Development, vol. 14. pp. 402-408. Jul. 1970.

[Calin 95] Cahn. Th., F. L. Vargas, and M. Nicolaidis,"Upset Tolerant CMOS Using Current Monitoring: Prototype and Test Experiments", Proc. Int. Test Conference, pp. 45-53. 1995.

[Chen 96] Chen. C. L.,"Symbol Error Correcting Codes for Memory Applications",Proceedings of Fault Tolerant Computing Systems, pp. 200-207. 1996.

[Dutta 07] Dutta, A., and N. Touba."Multiple Bit Upset Tolerant Memory Using a Selective Cycle Avoidance Based SEC-DED-DAEC Code.", Proceedings of VLSI Test Symposium. 2007.

[Datta 09] Dutta, R., and N. Touba."Exploiting Unused Spare Columns to Improve Memory ECC.", Proceedings of VLSI Test Symposium, 2009.

[Fuziwara 98] Fujiwara, E., T. Ritthongpitak and M. Kitami,"Optimal Two-Level Unequal Error Control Codes for Computer Systems", IEEE Trans. FTCS vol. 47. No. 12. pp. 1313-1325. Dec. 1998.

[Gill 05] Gill. B.. M. Nicolaidis. and C. Papachristou," Radiation Induced Single-Word Multiple-bit Upsets Correction in SRAM". Proc. of Int. Online Test Symposium. pp. 266-271. Jul. 2005.

[Hamming 50] Hamming. R.W., "Error Correcting and Error Detecting Codes", Bell Sys. Tech. Journal, vol. 29, pp. 1-17-160. Apr. 1950.

[Hsiao 70] Hsiao. M. Y., "A Class of Optimal Minimum Odd-weight-column SEC-DED codes", IBM Journal of Research and Development. vol. 14. pp. 395-401. 1970.

[Kawakami 04] Kawakami. Y., et al., "Investigation of Soft Error Rate Including Multi-Bit Upsets in Advanced SRAM Using Neutron Irradiation Test and 3D Mixed-mode Device Simulation". Proc. of IEEE Intl Electronic Device Meeting, pp. 945-948. Dec. 2004.

[Maiz 03] Maiz, J., S. Hareland, K. Zhang. and P. Armstrong, "Characterization of Multibit Soft Error Events in Advanced SRAMs", Proc. of IEEE hill Elecrtronic Device Meeting. pp. 5 19-522, Dec. 2003.

[Makihara 00] Makihara. A.. et al., "Analysis of Single-Ion Multiple-Bit Upset in High-Density Drams". Proc. IEEE Trans. on Nuclear Science. vol. 47, No. 6. Dec. 2000.

[Ming 2011] Ming. Z., Xiao Li Yi. Luo Horw, Wei, "New SEC-DED-DAEC Codes for Multiple Bit Upsets Mitigation in Memory", IEEE/IFIP 19'11 International Conference on VLSI and System-On-Chip. 2011.

[Nicolaidis 05] Nicolaidis, M. "Design techniques for soft error mitigation", IEEE Trans. on Device and Materials Reliability. vol. 5. Iss. 3. pp. 405-418. Sep. 2005.

[Revirievo 09] P. Reviriego, J.A. Maestro, "Study of the effects of multibit error correction codes on the reliability of memories in the presence of MBUs." IEEE Trans. Dev. Mater. Rehab.. vol. 9, No. 1, pp. 31-39,Mar. 2009.

[Reddy 78] Reddy, S.M.. "A Class of Linear Codes for Error Control in Byte-per-Card Organized Memory Systems", IEEE Trans. on Computers, vol. C 27. pp. 455-458. May. 1978.

[Richter 2008] Richter. M., K. Oberlaender, and M. Goessel, "New Linear SEC-DED Codes With Reduced Triple Error Miscorrection Probability", Proc. of International On-Line Testing Symposium, pp. 37-42. 2008.

[Satoh 2000] Satoh. S., Y. Tosaka, S. A. Wender, "Geometric Effect of Multiple-bit Soft Errors Induced by Cosmic-ray Neutrons on DRAMs", Proc. of IEEE hill Electronic Device Meeting. pp. 310-312. Jun. 2000.

\* cited by examiner $$\begin{pmatrix} 11010110101001100010010011000000000000100010101111111111111111100000001 \\ 01000010111010100010110101010010101011001101010000010000101101100000010 \\ 11110001101001110110011111100100010101010101010001010000101001010000100 \\ 00011110100111010011111011001010001100010010010010010100100001000001000 \\ 11001101010111000001000011100001010101001000001011000011000100000001000 \\ 01011111001001101110100000001101100010010100101000100100001000100100000 \\ 10110010001000011001010110110101101000101000100100010010100000001000000 \\ 10100100110100101100001000011010010010100011000010000100100010010000000 \end{pmatrix} \quad - 700$$

| Codes | Miscorrection probability for non-adjacent double errors (x100)% | | | | | Chk bits | Code (n, k) |
|---|---|---|---|---|---|---|---|
| | (d=2) (up to separation 1) | (d=3) (up to separation 2) | (d=4) (up to separation 3) | (d=5) (up to separation 4) | (d=n-1) | | |
| SEC-DED-DAEC in [Abramson 59] | 50.0 | 51.3 | 52.6 | 48.9 | 60.9 | 6 | (22, 16) |
| SEC-DED-DAEC in [Dutta 07] | 60.0 | 71.8 | 71.9 | 68.4 | 56.2 | 6 | (22, 16) |
| Proposed SEC-DED-DAEC--2 | 0 | 28.2 | 42.1 | 46.1 | 55.2 | 6 | (22, 16) |
| Proposed SEC-DED-DAEC--5 | 0 | 0 | 0 | 0 | 23.4 | 7 | (23, 16) |
| SEC-DED-DAEC in [Abramson 59] | 86.5 | 60.2 | 59.3 | 64.1 | 54.9 | 7 | (39, 32) |
| SEC-DED-DAEC [Dutta 07] | 51.4 | 56.2 | 60.1 | 57.1 | 53.9 | 7 | (39, 32) |
| Proposed SEC-DED-DAEC--2 | 0 | 38.4 | 34.3 | 43.7 | 52.9 | 7 | (39, 32) |
| Proposed SEC-DED-DAEC--5 | 0 | 0 | 0 | 0 | 25.7 | 8 | (40, 32) |
| SEC-DED-DAEC in [Abramson 59] | 91.4 | 56.8 | 62.3 | 55.8 | 53.7 | 8 | (72, 64) |
| SEC-DED-DAEC [Dutta 07] | 50.0 | 53.9 | 50.7 | 50.3 | 52.9 | 8 | (72, 64) |
| Proposed SEC-DED-DAEC--2 | 0 | 26.6 | 38.6 | 44.9 | 52.2 | 8 | (72, 64) |
| Proposed SEC-DED-DAEC--5 | 0 | 0 | 0 | 0 | 24.1 | 9 | (73, 64) |
| Proposed SEC-DED-DAEC--75 | 0 | 0 | 0 | 0 | 0 | 12 | (76, 64) |

FIG. 10

| Codes | (23,26) | (40,32) | (73,63) |
|---|---|---|---|
| SEC-DED-DAEC-CEM-d | 23.4 | 25.7 | 24.1 |
| [Datta 09] | 29.4 | 27.4 | 26.9 |

1102

| N=22 | | N=39 | | N=72 | |
|---|---|---|---|---|---|
| Sec-ded-daec-cem-2 | Other best known DAEC | Sec-ded-daec-cem-2 | Other best known DAEC | Sec-ded-daec-cem-2 | Other best known DAEC |
| .0611 | >0.5 | .0577 | >0.39 | .0572 | >0.30 |

1104

| N=23 | | N=40 | | N=73 | |
|---|---|---|---|---|---|
| Sec-ded-daec-cem-5 | Other best known DAEC | Sec-ded-daec-cem-5 | Other best known DAEC | Sec-ded-daec-cem-5 | Other best known DAEC |
| .000026 | >0.29 | .000029 | >0.27 | .000027 | >0.26 |

LOW COST ADJACENT DOUBLE ERROR CORRECTING CODE

PRIORITY CLAIM

This application claims priority under 35 U.S.C. 119 to USA application No. 61/588,843 filed on Jan. 20, 2012, which is incorporated herein by reference in its entirety.

BACKGROUND

Technology process improvement have resulted in dense memory cells that store information with less capacitance and lower voltage. Consequently, less charge is required to produce one or more soft errors in memories. High-energy neutrons and alpha particles from ionizing radiation can cause a single-event upset (SEU) that may alter the state of the system resulting in a soft error. With miniaturization of transistors, a SEU is more likely to cause a multiple bit upset. Multiple Bit Upsets (MBUs) have become increasingly more frequent with continued increase in memory density.

Existing adjacent error correcting codes suffer from high probability of mis-correction of nonadjacent double errors. Nonadjacent double errors can occur due to scattering effect or from second order particles emitted from a SEU in a nearby memory cell. The distance between the bits in error is typically limited because the scattered particles steadily loose energy beyond a small distance. Mis-correction of a nonadjacent double error as an adjacent double error reduces the reliability of the memory incorporating such codes.

The probability of adjacent double bit errors is higher than other multiple bit errors, although the likelihood of nonadjacent double errors remains significant. The probability of non-adjacent double errors decreases exponentially as the distance between the bits in error increases.

The well known SEC-DED (Single Error Correcting-Double Error Detecting) Hamming code is capable of correcting any single-bit error and detecting all possible double bit errors. It is commonly used in memories and caches, but cannot correct more than a 1-bit error in a word. BCH codes are more reliable but require more overhead.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

Figure 8:
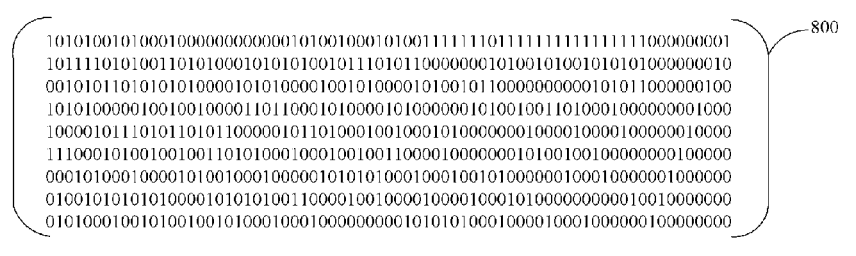

FIGS. 5, 6, 7 and 8 show H-matrices for (39,7), (40,8), (72,8), and (73,9) SEC-DED-DAEC-CEM codes 500-800, respectively.

FIG. 9 shows the H-matrix for a SEC-DED-DAEC-CEM-76 code 900 which eliminates mis-correction for all possible double errors.

FIG. 10 compares mis-correction probabilities for different SEC-DED-DAEC codes 1000.

FIG. 11 shows mis-correction probabilities against random non adjacent double errors for some described new codes and [Datta 09].

DETAILED DESCRIPTION

Preliminaries

Figure 1:
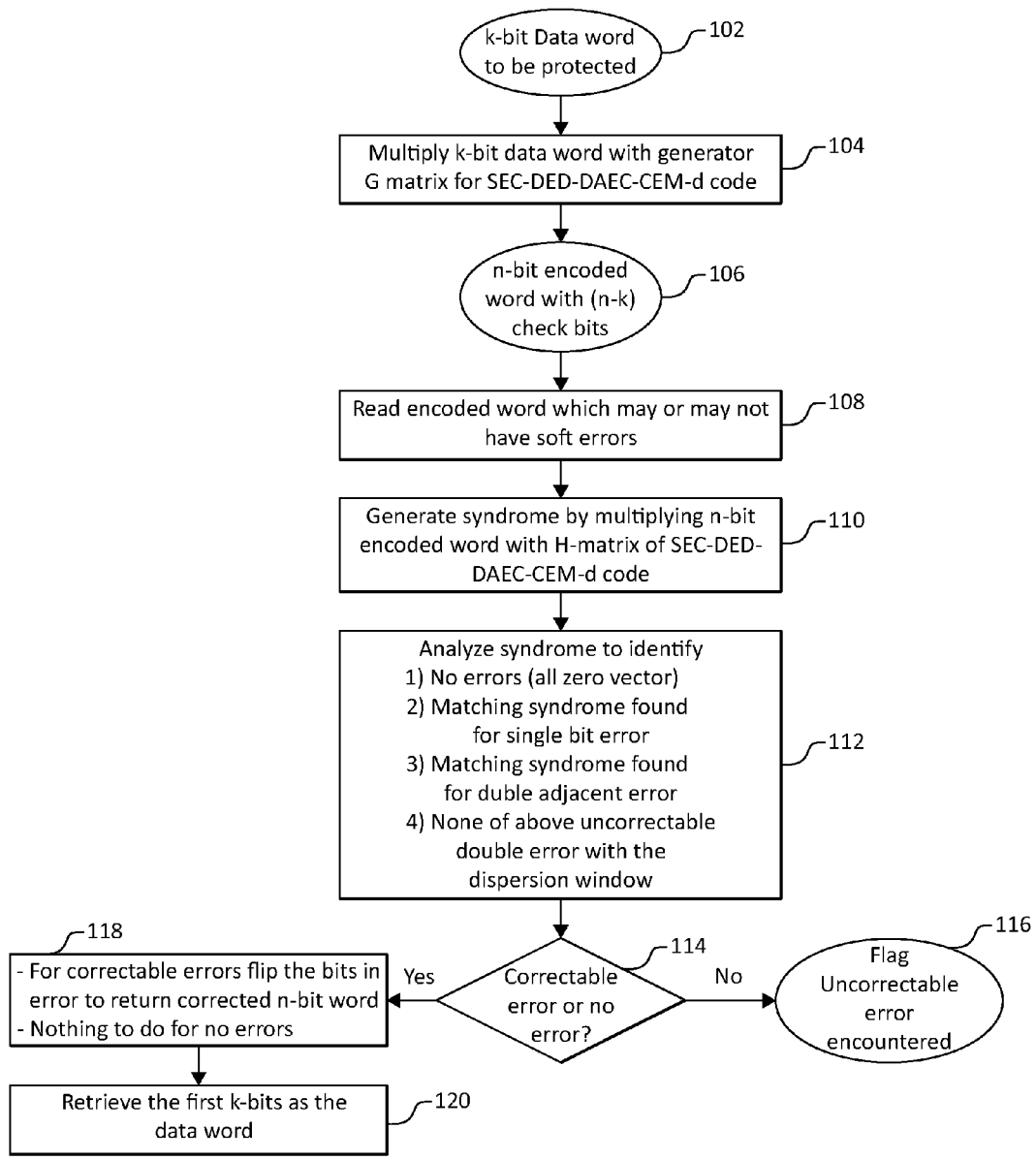
FIG. 1 illustrates a process of protecting data words with ECCs.

References to "one embodiment" or "an embodiment" do not necessarily refer to the same embodiment, although they may. Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively, unless expressly limited to a single one or multiple ones. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list, unless expressly limited to one or the other.

"Logic" refers to machine memory circuits, machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic.

Those skilled in the art will appreciate that logic may be distributed throughout one or more devices, and/or may be comprised of combinations memory, media, processing circuits and controllers, other circuits, and so on. Therefore, in the interest of clarity and correctness logic may not always be distinctly illustrated in drawings of devices and systems, although it is inherently present therein.

The techniques and procedures described herein may be implemented via logic distributed in one or more computing devices. The particular distribution and choice of logic is a design decision that will vary according to implementation.

The term "matrix" is used herein to describe a commonly employed machine memory organization of data values (e.g., bits or groups of bits). Those having skill in the art may, in light of the following description, utilize data organizations in conformance with the described matrices, which may or may not be a "matrix" but which are in conformance with the data processing properties represented by one or more of the described matrices.

Overview

The following acronyms are used in the description and/or drawings:

SEU—Single Event Upset
MBU—Multiple Bit Upset
SEC—Single Error Correcting
DED—Double Error Detecting
DAEC—Double Adjacent Error Correcting
ECC—Error Correcting Code
CEM—Complete Elimination of Miscorrection
[Abramson 59]—Abramson N. M., "A Class of Systematic Codes for Non-Independent Errors", Proc. IRE Trans. on Information Theory, Vol. IT-5. pp. 150-157. December 1959.
[Dutta 07] Dutta, A., and N. Touba. "Multiple Bit Upset Tolerant Memory Using Selective Cycle Avoidance Based SEC-DED-DAEC Code.", Proceedings of VLSI Test Symposium. 2007.
[Datta 09] Datta, R., and N. Touba. "Exploiting Unused Spare Columns to Improve Memory ECC.", Proceedings of VLSI Test Symposium, 2009.

A new class of ECCs is described to aid the design of MBU tolerant memories that can correct all single bit errors and double adjacent bit errors, as well as detect all double bit errors. The new codes eliminate mis-correction of non-adjacent double errors where the error bits are separated by up to (d−1) bits.

The described ECCs are SEC-DED-DAEC-CEM-d codes. They comprise a number of check bits comparable to conventional Hamming SEC-DED ECCs for comparable word lengths and protection/correction capabilities, while providing greater protection against the most-likely errors caused by a single event upset (SEU). The encoding and decoding latencies and complexities as well as hardware overhead are comparable to conventionally used SEC-DED Hamming ECCs.

The described ECCs provide protection against most likely errors caused by an SEU, with trade-off between mis-correction probability and check bit overhead, and trade-off between dispersion window size (d) and check bit overhead. They provide flexibility in controlling the depth of memory interleaving. This provides flexibility with the size and orientation of memory blocks and the related floor-planning, access times, and power consumption.

Based on the choice of d (dispersion window size), the number of check bits and encoding/decoding overhead/latencies are comparable to conventional SEC-DED codes.

A heuristic search code derivation strategy is described for deriving an error correcting code with varying degrees of mis-correction probability. Several pre-devised codes are presented for different applications.

SEC-DED-DAEC-CEM-2 codes for 16, 32 and 64-bit memory with (d=2) that use the same number of check bits as conventional SEC-DED codes.

SEC-DED-DAEC-CEM-5 codes which use only one additional check bit compared to conventional SEC-DED codes.

SEC-DED-DAEC-CEM-76 codes for protecting a 64-bit memory word which eliminate mis-correction of all non-adjacent double errors but still use less check bits compared to conventional double error correcting (DEC) codes.

The encoding/decoding hardware along with the encoding/decoding process are described.

DESCRIPTION OF PARTICULAR EMBODIMENTS

FIG. 1 illustrates a process of protecting data words with ECCs. The data word (k bits) is applied 102 to an encoding matrix G 104. This results in an n bit encoded data word 106, which is read (e.g., from a memory, from a communication packet, etc.) 108 and applied to a decoding matrix H to generate a decoding syndrome 110. The syndrome is analyzed 112 to determine if there is a correctable error or no error 114. If yes, the correctible error is corrected 118, or nothing is done is done if there's no error. The first k bits of the encoded word are the data word. Otherwise, an uncorrectable error is identified 116.

The following conditions must be satisfied by the decoding (H) matrix for the SEC-DED-DAEC-CEM-d codes:

No all 0 columns.
All columns are distinct
No linear dependency involving 3 or less columns i.e., no 2-cycle and 3-cycle are allowed. (row-wise addition of bits for every set of two or three rows, module 2, does not yield a column of all zeros)
No linear dependency involving columns $C_i$, $C_j$, $C_k$, $C_m$, where m>k>j>i, such that j=i+1 and m=k+1.
No linear dependency involving columns $C_i$, $C_j$, $C_k$, $C_m$, where m>k>j>i, such that (j=i+1 and m−k=q) or (k j+1 and m−i=q) or (m=k+1 and j−i=q) for all integer values of q such that q >1(non-adjacent) and q<=d.

For a given 'data word' length (k), and a dispersion window "d", at least 'r' check-bits are needed to meet all the code constraints. The length 'n' of the encoded data word is then k+r bits.

For particular values of k and d, >=r bits may be used to derive a code that satisfies the described constraints.

For example,
With k=16, d=2, r can be >=6
With k=16, d=5, r can be >=7
With k=32, d=2, r can be >=7
With k=32, d=5, r can be >=8
With k=64, d=2, r can be >=8
With k=64, d=5, r can be >=9
With k=64, d=75, r can be >=12

More generally, there can be a range of d values for a given k and a minimum r value:
With k=16, d=2, r can be >=6
With k=16, d>2 to d<=5, r can be >=7
With k=32, d=2, r can be >=7
With k=32, d>2 to d<=5, r can be >=8
With k=64, d=2, r can be >=8
With k=64, d>2 to d<=5, r can be >=9
With k=64, d>2 to d<=75, r can be >=12

A further generalization yields:
With k=16, d=2, r can be >=6
With k=16, d>2 to d<=5, r can be >=7
With k>16 to k<=32, d=2, r can be >=7
With k>16 to k<=32, d>2 to d<=5, r can be >=8
With k>32 to k<=64, d=2, r can be >=8
With k>32 to k<=64, d>2 to d<=5, r can be >=9
With k>32 to k<=64, d>2 to d<=75, r can be >=12

In general d>=2 and d<=n−1 for all "n" (e.g., >=16, <=2048). For a given k and d, the described process(es) will find the minimum number of check bits needed to satisfy the constraints (k+r=n), where r is the number of check bits.

For any adjacent error (double, triple, quadrapule, 5, 6 . . . (n−1)) the describes codes guarantee no miscorrection for non-adjacent double errors within a dispersion window d. For example, for triple adjacent errors the constraints on the decoding matrix become:

no linear dependency involving columns Ci, Cj, Ck, Cm, Cn where n>m>k>j>i, such that
j=i+1 and k=j+1 and n−m=q
k=j+1 and m=k+1 and n−i=q n=m+1 and m=k+1 and j−i=q
for all integer values of q such that q>1 and q<=d.

Each type of adjacent error correcting code will have its own set of conditions.

Figure 2:
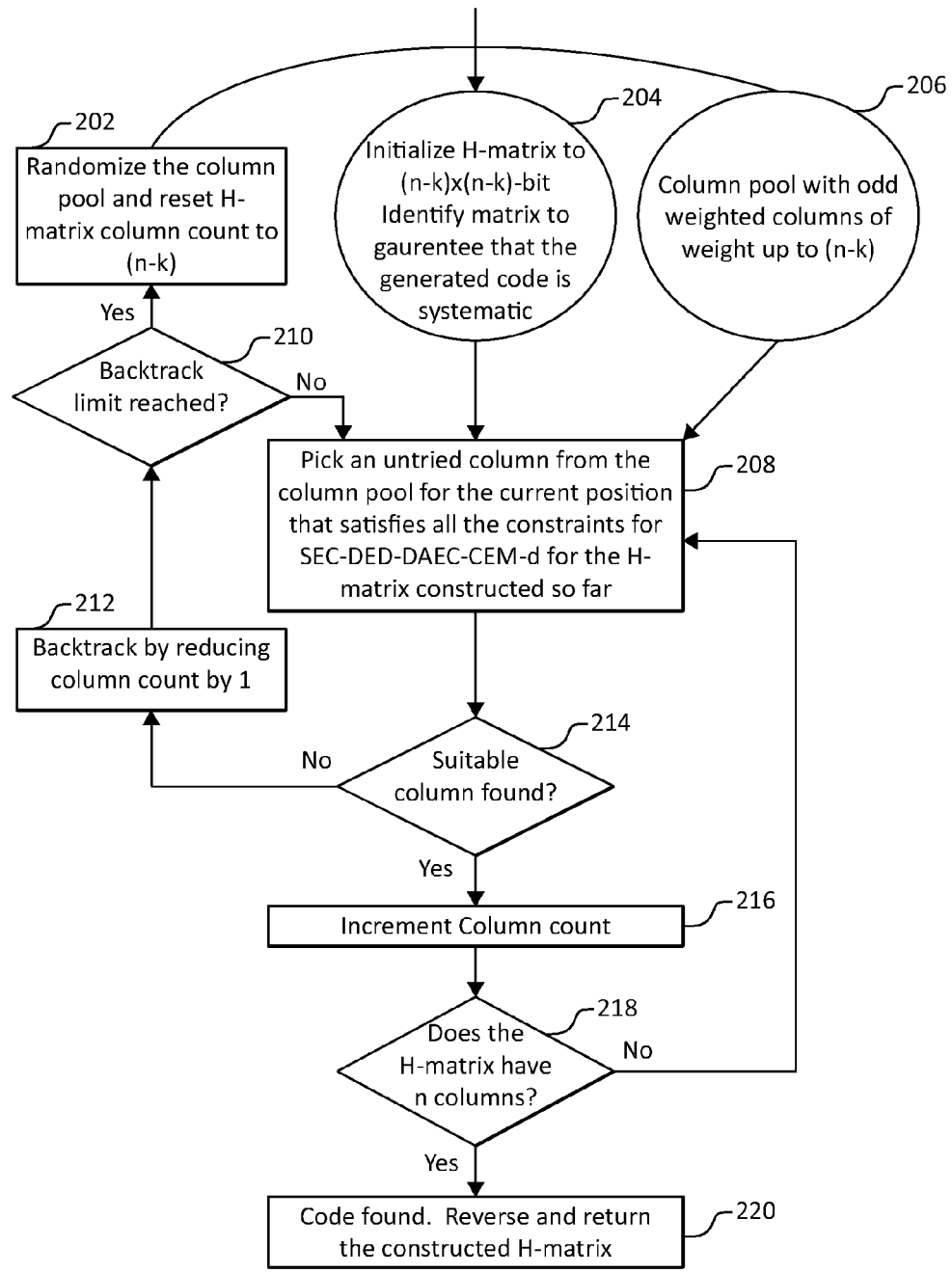
FIG. 2 illustrates a pseudo-exhaustive constraint driven greedy randomized search based heuristic for finding a decoding matrix for the described ECCs.

Condition 5 ensures that there is no mis-correction of non-adjacent double errors where the bits in error are separated by at most d−1 bits. By properly choosing the parameter [d], mis-correction of the most likely nonadjacent double errors can be eliminated. The constraints may be modeled into a SAT problem for use with a SAT solver application program. Alternatively, a pseudo-exhaustive constraint driven greedy randomized search based heuristic may be used, as follows (see also FIG. 2).

Start with the identity matrix I [(n−k)×(n−k)] 204 to ensure that the resultant code is systematic (data bits and check bits are not interleaved), where n=k+r, where r is the ECC bit length and k is the bit length of the data being protected.

Add all distinct odd weighted columns (number of is in the column is odd) to the column pool 206. This may involve simply initializing a non-repetitive odd column generator function.

Perform backtracking search (start with I matrix, add a column from the pool 208, check constraints 214). Select a column and add to the H-matrix as long as all the constraints (1 through 5) are met within the back tracking limit. A previous column selection for the H-matrix may be removed if the search is not converging on a solution 212, 210.

If the backtracking limit is exceeded 210 in the previous step 212, re-order the column pool to start from a different randomized state of the column pool 202. This may simply involve re-seeding a non-repetitive odd-weighted column generator function.

Stop when the constructed length of the H-matrix reaches the length (n) and all constraints are still satisfied 216, 218. Reverse the columns to obtain the H-matrix of the systematic code 220.

The above is a pseudo code for an exhaustive search of the column pool starting from a randomized state for a code that satisfies all the constraints.

Figure 3:
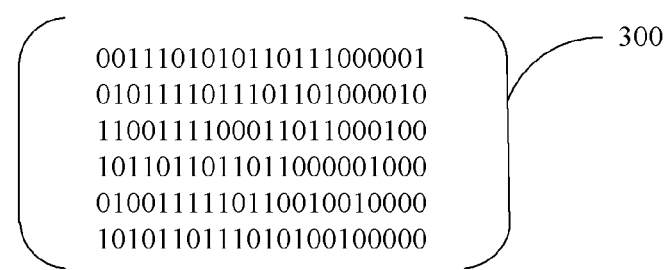
FIG. 3 illustrates an H-matrix (decoding matrix) for a (22 total bits, 16 data bits) SEC-DED-DAEC-CEM-2 code 300 which eliminates mis-correction of non-adjacent double errors of the form i, i+2 with any adjacent double error.

FIG. 3 shows an H-matrix for a (22 total bits, 16 data bits) SEC-DED-DAEC-CEM-2 code 300 which eliminates mis-correction of non-adjacent double errors of the form i, i+2 with any adjacent double error. This is a significant improvement compared to conventional SEC-DED or SEC-DAEC codes which suffer from high mis-correction probability.

Figure 4:
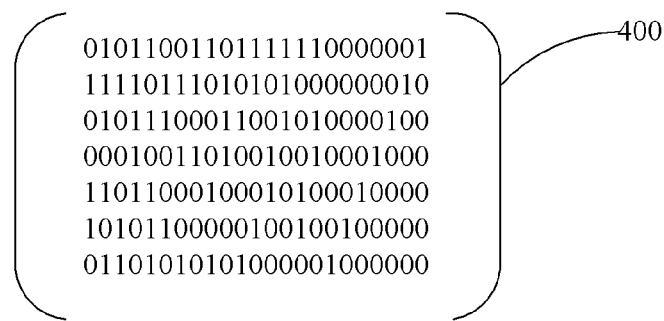
FIG. 4 shows the H-matrix for a (23, 16) SEC-DED-DAEC-CEM code 400 which introduces an additional check bit to eliminate mis-correction of all non-adjacent double errors of the form (i, i+2), (i, i+3), (i, i+4), (i, i+5) with any adjacent double error i.e. (k, k+1) for any k<codelength (n) and >=1.
Figure 5:
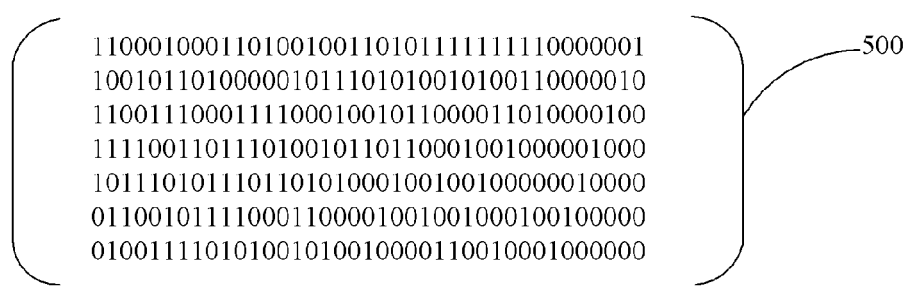
Figure 6:
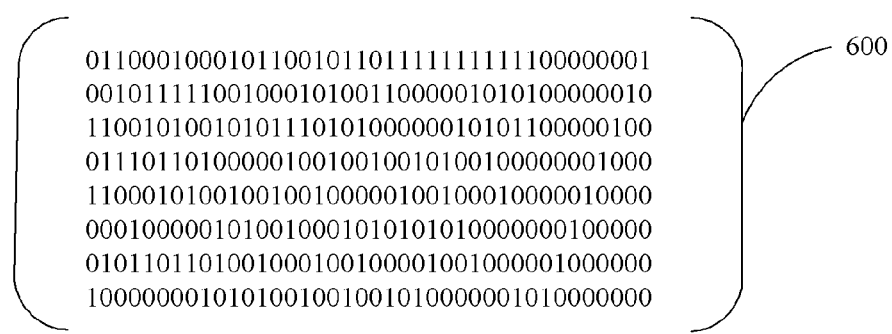

FIG. 4 shows the H-matrix for a (23, 16) SEC-DED-DAEC-CEM code 400 which introduces an additional check bit to eliminate mis-correction of all non-adjacent double errors of the form (i, i+2), (i, i+3), (i, i+4), (i, i+5) with any adjacent double error i.e. (k, k+1) for any k<codelength (n) and >=1. Significant reduction in mis-correction probability is achieved by introducing one additional check bit.

FIGS. 5, 6, 7 and 8 show H-matrices for (39,7), (40,8), (72,8), and (73,9) SEC-DED-DAEC-CEM codes 500-800, respectively.

Figure 9:
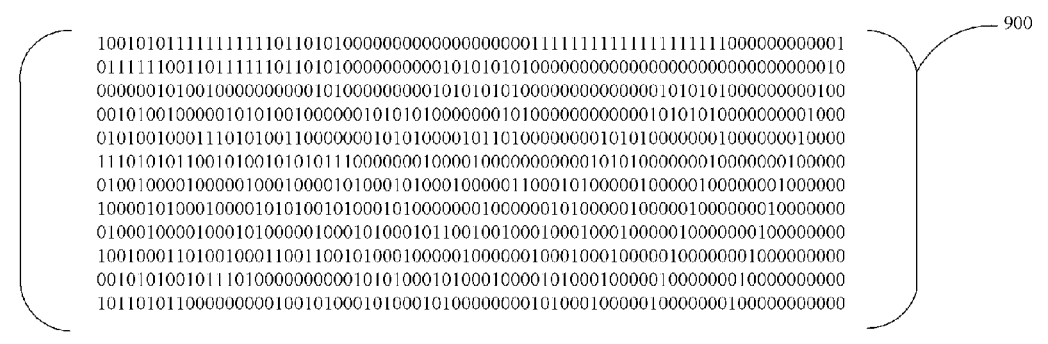

FIG. 9 shows the H-matrix for a SEC-DED-DAEC-CEM-76 code 900 which eliminates mis-correction for all possible double errors. It requires 12 check bits, fewer than for prior art double error correcting codes (14 check bits).

FIG. 10 compares mis-correction probabilities for different SEC-DED-DAEC codes 1000. As can be seen from FIG. 10, the mis-correction profile for non-adjacent double errors within the specified window is the best (0) for the proposed code. The check bit overhead is same as SEC-DED code when d=2. Only one additional check bit is needed when d=5. To determine mis-correction probability, define a 4-cycle in the H-matrix of a code of the form $C_i$, $C_j$, $C_k$, $C_m$ where m>k>j>i, such that j=i+1 and m−k=q or k=j+1 and m−i=q or m=k+1 and j−i=q where q>1 (non-adjacent) as $4BC_q$. A $4BC_q$ corresponds to the mis-correction of a non-adjacent double error of the form (p, p+q) i.e., separated by q−1 bits with an adjacent double error. The mis-correction probability of non-adjacent double errors separated by up to d−1 bits is:

$$\frac{\sum_{q=2,\ldots,d} \#4BC_q}{\sum_{q=2,\ldots,d} (n-q)} \quad (1)$$

For example, the mis-correction probability of nonadjacent double errors separated by up to 4 bits (d=5) is computed as: (($\#4BC_2+\#4BC_3+\#4BC_4+\#4BC_5$)/((n−2)+(n−3)+(n−4)+(n−5))).

The SEC-DED-DAEC-CEM-2 codes use the same number of check bits as the conventional SECDED-DAEC codes, but eliminate the mis-correction probability of the most likely non-adjacent double errors i.e., (i, i+2).

By using only one extra check bit, the SEC-DED-DAEC-CEM-5 codes eliminate the mis-correction possibility of non-adjacent double errors of the form (i,i+2), (i,i+3), (i,i+4), (i,i+5).

The (76, 64) code eliminates mis-correction for any non-adjacent double error, but using fewer check bits (12) compared to conventional DEC codes (14).

No effort is made to reduce the overall probability of non-adjacent double error outside the dispersion window. As a side effect of the complete elimination of double error mis-correction within the dispersion window, the overall mis-correction probability is reduced.

FIG. 11 shows mis-correction probabilities against random non-adjacent double errors for some described new codes and [Datta 09]. The table corresponding to FIG. 1102 shows the mis-correction probabilities against random non-adjacent double errors, Codes with same number of check-bits are compared. The described codes have the least miscorrection probabilities when compared with the best known code so far that explicitly tries to minimize miscorrection of random non-adjacent double error [Datta 09].

The mean time to failure for memory under multiple bit upsets is given by the following model: (1/failure_rate) *square_root((II*#memory_words)/(2*/(i+j>L)[pi*pj*(1−(L/N))]))

where L is the error correction capacity and pi and pj are i and j bit error probabilities such that (i+j>L) and N is the number of bits per memory words including the check bits. The proposed SEC-DED-DAEC-CEM-d codes are more reliable than SEC-DED, SEC-DAEC, SEC-DED-DAEC codes. This is because within the dispersion window "d", no mis-correction happens and non-adjacent double errors within that window can distinguished from any adjacent double error, which improves the error correction accuracy.

The increased reliability may be demonstrated by computing the expected miscorrection probabilities for the different DAEC codes under the exponential charge decay model for the scattered particles. The probability of non-adjacent double errors decreases exponentially with the increase of the dispersion window.

P(i,i+k)=Probability of MBU of the form (i, i+k) induced by an SEU (for k>=1)

PM(i,i+k)=Probability of miscorrection of the error of form (i,i+k) with an adjacent double error.

For the proposed SEC-DED-DAEC-CEM-d codes, PM(i, i+k)=0 for all k (k=1, ..., d).

However the above is not true for any other DAEC code.

Assume the probability of an adjacent double error caused by an SEU is P(i,i+1), under the simplified exponential charge decay model, $$P(i,i+2)=(1/C1)*P(i,i+1);$$

$$P(i,i+3)=(1/C2)*P(i,i+2)=(1/C2)*(1/C1)*P(i,i+1)=(1/C2)*P(i,i+1) \text{ (approximate)}$$

$$P(i,i+n-1)=(1/C(n-1))*P(i,i+1)$$

The expected miscorrection probability of a non-adjacent double error caused by an SEU is:

$$\Sigma j=-15 o(n-1) P(i,i+j)*PM(i,i+j)$$

The tables 1104 and 1106 show the "expected miscorrection probability" under the exponential charge decay model for the SEC-DED-DAEC-CEM-d codes (assuming no interleaving, and C=0.1) and compares it against the known best codes so far. As seen from the tables, the proposed codes are more reliable because they eliminate the miscorrection probability for the most likely non-adjacent double errors (within the dispersion window).

Check Bit Generator and Syndrome Generator Logic

The encoding matrix G and the decoding matrix H for a particular ECC are related to one another, and one may be derived from another, for example as follows:

$$H=[P(r \times k), I(r \times r)]$$

$$G=[I(k \times k), P(T)]$$

k=number of data bits
r=number of check bits
T=transpose
(k+r)=n=number of encoded data bits Example H<=(k=4, r=4, n=8)
11010001
01100010
00100100
01011000
In this case
P<=
1101
0110
0010
0101
P(T)<=(rows become columns)
1000
1101
0110
1001
G<=
10001000
01001101
00100110
00011001

During encoding, the data bits may be directly copied and the check bits generated using XOR logic configured to implement the G matrix. Decoding may be carried out as follows:

Generate the decoding syndrome, which is one or more columns of the H matrix linearly combined (added module 2) using XOR logic corresponding to the H-matrix.

If the syndrome is the all zero vector, then no error is detected, otherwise one or more errors occurred.

If the syndrome matches any of the H-matrix columns then a single error is detected and the error position is the corresponding column position. The corresponding bit should be flipped to correct the error.

Else if the syndrome matches any of the n−1 adjacent double error syndromes, then a double adjacent error is detected and the corresponding bit positions are generated using the error correction logic.

Else an uncorrectable error (i.e., a double non-adjacent error or more than two errors) has occurred.

Figure 12:
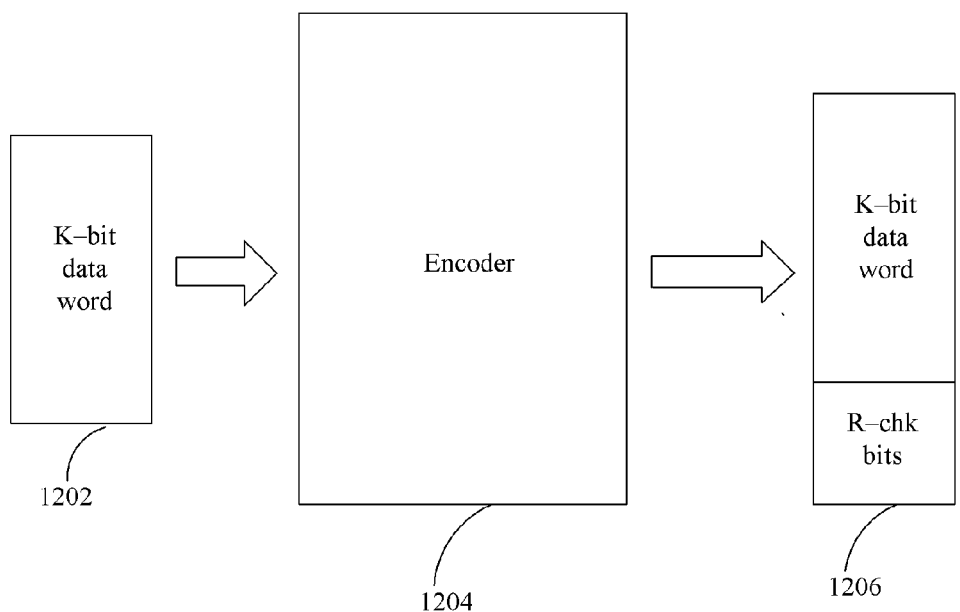
FIG. 12 and FIG. 13 illustrate example encoder logic for an SEC-DED-DAEC-CEM-2 code (22, 16).
Figure 13:
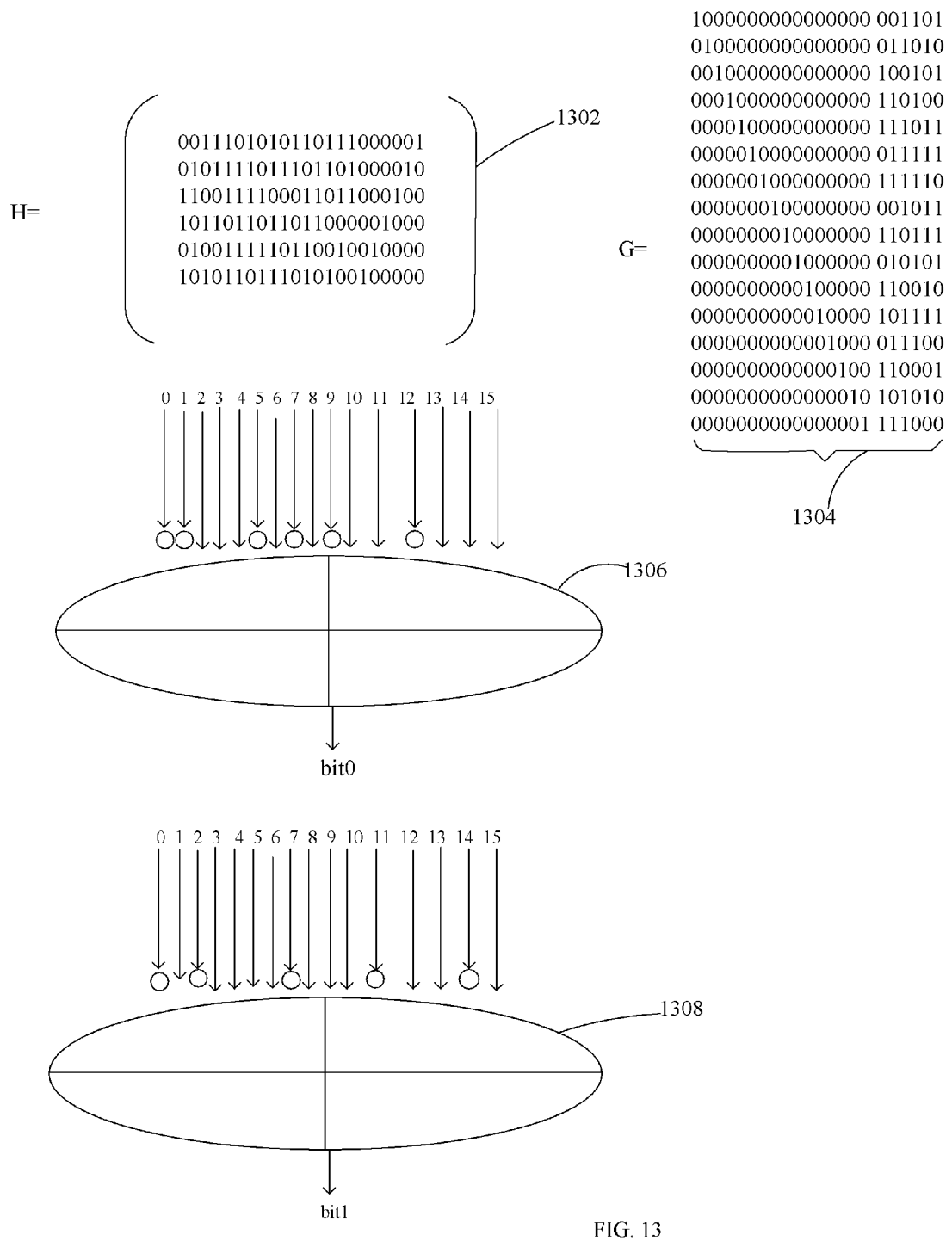

FIG. 12 and FIG. 13 illustrate example encoder logic for an SEC-DED-DAEC-CEM-2 code (22, 16). Both an H-matrix 1302 (6, 22) and a G-matrix 1304 (16, 22) for the code are shown. The two matrices can be derived from each other as explained previously. The input to the encoder logic 1204 is the k-bit data word 1202 to protect with the check bits. The output 1206 is the n=(k+r)-bit encoded word, k data bits and r check bits. The k-bit data word is directly copied to the output (using the Identity matrix part of the G-matrix).

An example of ECC generator logic is illustrated in FIG. 13. Check bit 0 is generated using logic 1306 to XOR all data bits with polarities determined by the $16^{th}$ column of the G-matrix (starting from 0-th column). Physical implementation may use 2 or 3 input XOR gates leading to a logic depth of 4 or less.

Check bit 1 is generated using logic 1308 to XOR all data bits with polarities determined by the $17^{th}$ column of the G-matrix (starting from 0-th column). Physical implementation may use 2 or 3 input XOR gates leading to a logic depth of 4 or less.

Figure 14:
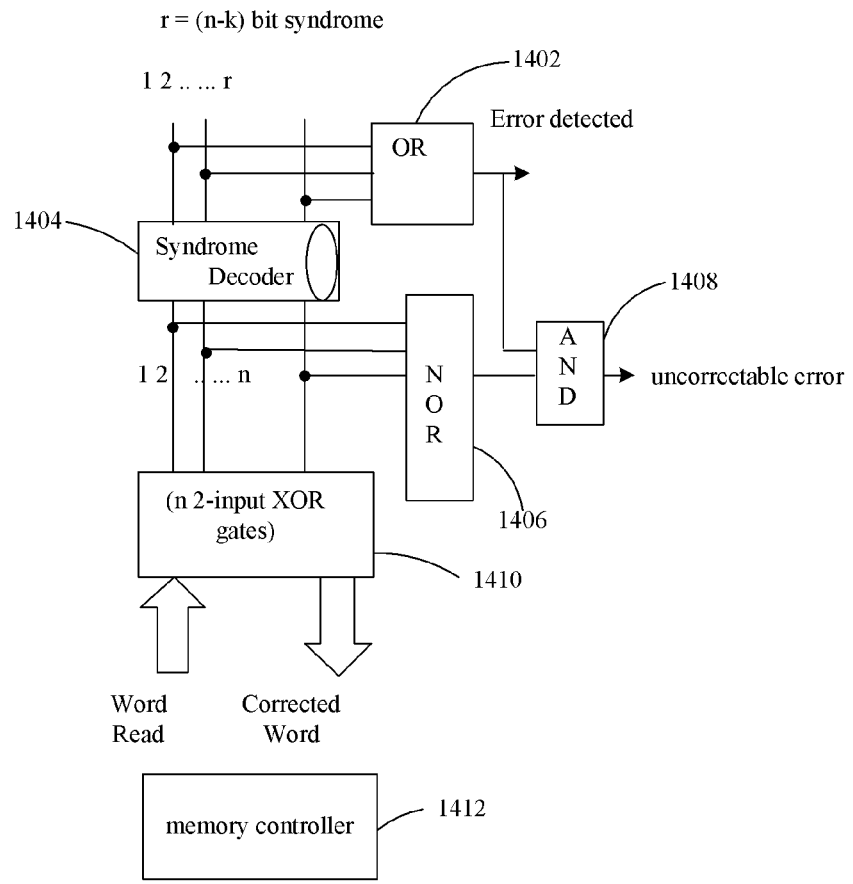
FIG. 14 illustrates exemplary logic to carry out decoding of an ECC protected data word.

FIG. 14 illustrates exemplary logic to carry out decoding of an ECC protected data word. A data word (e.g., a k bit data word protected with r check bits) is input to an XOR network 1410 along with the output of a syndrome decoder 1404. The r syndrome bits are provided to the syndrome decoder 1404 and to OR logic 1402. The output of the syndrome decoder is also provided to NOR logic 1406. If both logic 1402 and 1406 output asserted values, an unrecoverable error has occurred in the protected data word. Otherwise, the output of the XOR network 1410 are the corrected data word (or the original data word if there was no error). In the illustrated implementation the data word is provided by a memory controller 1412, however, memory data protection is only one possible implementation that may benefit from the data protection provided by the described ECCs. Other implementations may utilize other types of controllers and logic, for example as set forth in the Implementations and Alternatives section of this Description.

Figure 15:
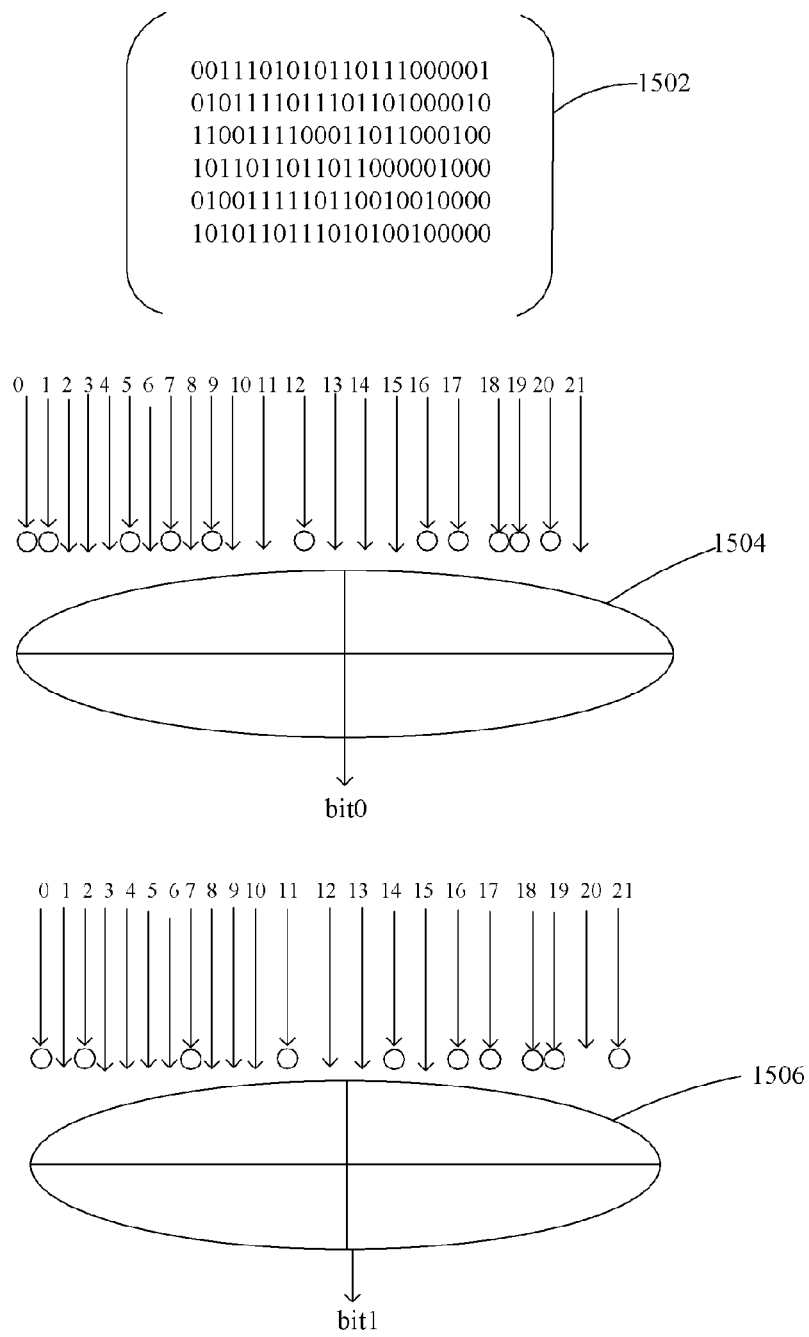
FIG. 15 illustrates an example of decoder logic for H matrix 1502.

FIG. 15 illustrates an example of decoder logic for H matrix 1502. For this example n=22, r=(22−16)=6. Decoded bit 0 is produced from the XOR logic 1504 inputting the bits of the encoded word with the polarities determined by the $1^{st}$ row of the H-matrix 1502. Physical implementation may be based on either 2-input or 3-input XOR gates leading to a logic depth of 5 or 6.

Decoded bit1 is produced from the XOR logic 1506 inputting the bits of the encoded word with the polarities determined by the $2^{nd}$ row of the H-matrix 1502. Physical implementation may be based on either 2-input or 3-input XOR gates leading to a logic depth of 5 or 6.

Figure 16:
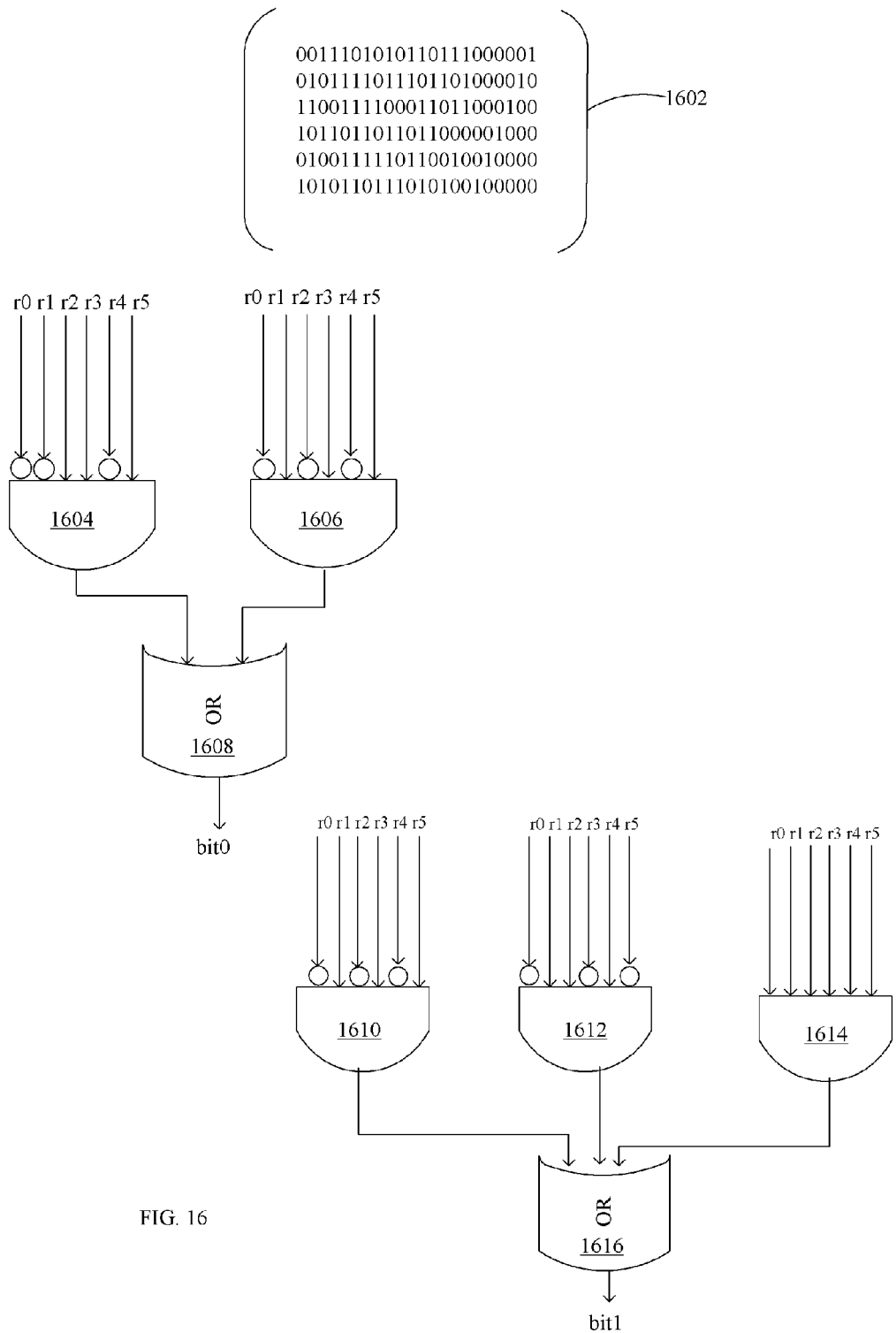
FIG. 16-17 illustrate an example of syndrome decoding logic corresponding to an SEC-DED-DAEC-CEM-2 code 1602 (22,16).
Figure 17:
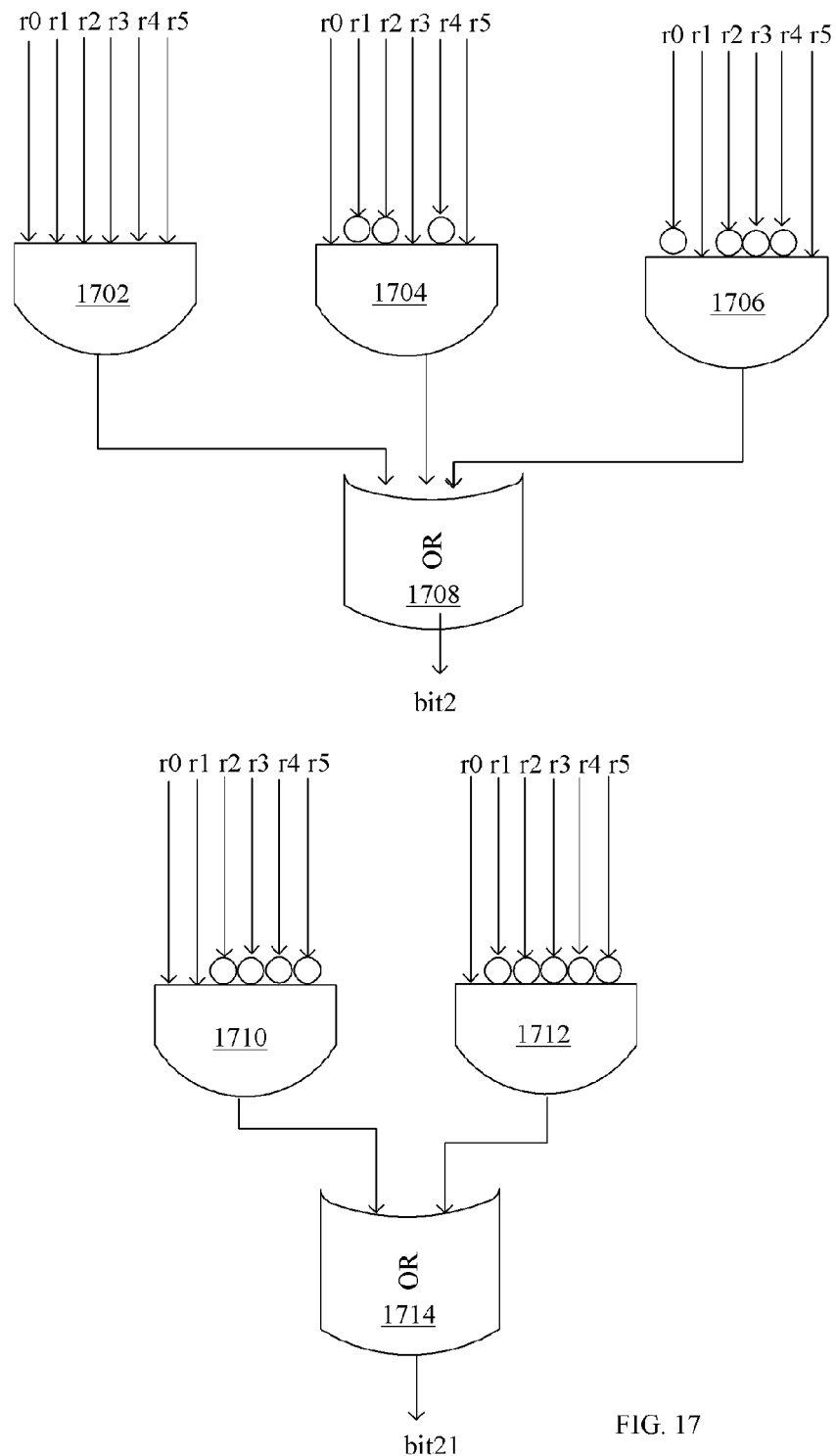

FIG. 16-17 illustrate an example of syndrome decoding logic corresponding to an SEC-DED-DAEC-CEM-2 code 1602 (22,16). The input to the syndrome decoder logic is the r-bit syndrome <r0,r1,r2,r3,r5,r5>, which is the vector found after multiplying an H-matrix (r×n) for the code 1602 with the encoded data of length n (i.e., after decoding the encoded data).

Bit0 of the decoded syndrome is asserted if error occurred in the $0^{th}$ bit of the encoded data or in the (0th and $1^{st}$ bit). The AND gate logic 1604 corresponds to column 0 of the H-matrix for the SEC-DED-DAEC-CEM-2 code 1602. The AND gate logic 1606 corresponds to the linear combination of column 0<001101> and column 1<011010> of the H-matrix, i.e., <010101>. The outputs of the AND gates 1604, 1606 are input to OR gate logic 1608 to produce the output bit Bit0.

Bit1 of the decoded syndrome is asserted if an error occurred in the (0th and $1^{st}$ bit) of the data or in the $1^{st}$ bit position or in the ($1^{st}$ and $2^{nd}$) bit positions. The AND gate logic 1610 corresponds to the linear combination of column 0<001101> and column 1<011010> of the H-matrix, i.e., <010101>. The AND gate logic 1612 corresponds to column 1 <011010> and AND gate logic 1614 corresponds to the linear combination of column 1 <011010> and column 2<100101> of the H-matrix, i.e., <111111>. The outputs of the AND gates 1610, 1612, and 1614 are input to OR gate logic 1616 to produce the output bit Bit1.

Bit2 of the decoded syndrome is asserted if an error occurred in the (1st and $2^{nd}$ bit) or in the 2nd bit position or in the (2nd and 3rd) bit position of the encoded data word. The AND gate logic 1702 corresponds to the linear combination of column 1<011010> and column 2<100101> of the H-matrix, i.e., <111111>. The AND gate logic 1704 corresponds to column 2<100101> and the AND gate logic 1706 corresponds to the linear combination of column 2<100101> and column 3<110100> of the H-matrix, i.e., <010001>. The outputs of AND gate logic 1702, 1704, and 1706 are provided to OR gate logic 1708.

Bit21 of the decoded syndrome is asserted if an error occurred in the (20th and 21st bit) or in the 21st bit position of the encoded data. The AND gate logic 1710 corresponds to the linear combination of column 20<010000> and column 21<100000> of the H-matrix, i.e., <110000>, and the AND gate logic 1712 corresponds to column 21<100000>. The outputs of AND gate logic 1710 and 1712 are provided to OR gate logic 1714.

Permutations of the described H-matrices may be employed to identify other ECCs with similar properties.

The described techniques may be employed while simultaneously minimizing the overall mis-correction probability to formulate a co-optimization problem. A higher order field (GF($2^K$)) may be formulated and used with the same approaches (multi-bit symbols).

The set of constraints can be varied from those described by those skilled in the art, to derive ECCs with different, error detection and correction profiles, XOR overhead, and/or encoding/decoding latencies.

Application of ECCS in accordance with the described approach include, in addition to improving memory reliability:

Securing data transfer in a network communication model
Improved cryptographic solutions.
Improved solvability of a set of linear equations.
A variety to technologies that utilizes linear matrix algebraic methods.

Implementations and Alternatives

The techniques and procedures described herein may be implemented via logic distributed in one or more computing devices. The particular distribution and choice of logic is a design decision that will vary according to implementation.

Those having skill in the art will appreciate that there are various logic implementations by which processes and/or systems described herein can be effected (e.g., hardware, software, and/or firmware), and that the preferred vehicle will vary with the context in which the processes are deployed. "Software" refers to logic that may be readily readapted to different purposes (e.g. read/write volatile or nonvolatile memory or media). "Firmware" refers to logic embodied as read-only memories and/or media. Hardware refers to logic embodied as analog and/or digital circuits. If an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory.

In a general sense, those skilled in the art will recognize that the various aspects described herein which can be implemented, individually and/or collectively, by a wide range of hardware, software, firmware, or any combination thereof can be viewed as being composed of various types of "circuitry." Consequently, as used herein "circuitry" includes, but is not limited to, electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), circuitry forming a memory device (e.g., forms of random access memory), and/or circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A device, comprising:
  a controller configured to provide a data word and check bits for the data word to decoding logic;
  the decoding logic configured to generate a decoding of the data word and check bits for the data word in conformance with an H-matrix having the following properties:
  (a) no all 0 columns;
  (b) all columns are distinct;
  (c) no linear dependency involving three or less columns;
  (d) no linear dependency involving columns $C_i, C_j, C_k, C_m$, where m>k>j>i, where j=i+1 and m=k+1; and
  (e) no linear dependency involving columns $C_i, C_j, C_k, C_m$, where m>k>j>i, where (j=i+1 and m-k=q) or (k=j+1 and m-i=q) or (m=k+1 and j-i=q) for all integer values of q such that q>1 and q<=d, where d>=2 and d<=n-1 where n-k is a number of the check bits.

2. The device of claim 1, the H-matrix configured to apply at least six (6) check bits to a 16-bit data word.

3. The device of claim 1, the H-matrix configured to apply at least seven (7) check bits to a data word with 16<data bits <=32.

4. The device of claim 1, the H-matrix configured to apply at least eight (8) check bits to a data word with 16<data bits <=32.

5. The device of claim 1, the H-matrix configured to apply at least eight (8) check bits to a data word with 32<data bits <=64.

6. The device of claim 1, the H-matrix configured to apply at least nine (9) check bits to a data word with 32<data bits <=64.

7. The device of claim 1, the H-matrix configured to apply at least twelve (12) check bits to a data word with 32<data bits <=64.

8. A device, comprising:
  a controller configured to provide a data word to encoding logic;
  the encoding logic configured to generate an encoding of the data word in conformance with a G-matrix corresponding to a decoding H-matrix having the following properties:
  (a) no all 0 columns;
  (b) all columns are distinct;
  (c) no linear dependency involving three or less columns;
  (d) no linear dependency involving columns $C_i, C_j, C_k, C_m$, where m>k>j>i, such that j=i+1 and m=k+1; and
  (e) no linear dependency involving columns $C_i, C_j, C_k, C_m$, where m>k>j>i, where m>k>j>i, where (j=i+1 and m-k=q) or (k=j+1 and m-i=q) or (m=k+1 and j-i=q) for all integer values of q such that q>1 and q<=d, where d>=2 and d<=n-1 where n-k is a number of check bits for the data word.

9. The device of claim 8, the G-matrix configured to generate at least six (6) check bits for a 16-bit data word.

10. The device of claim 8, the G-matrix configured to generate at least seven (7) check bits for a data word with 16<data bits <=32.

11. The device of claim 8, the G-matrix configured to generate at least eight (8) check bits for a data word with 16<data bits <=32.

12. The device of claim 8, the G-matrix configured to generate at least eight (8) check bits for a data word with 32<data bits <=64.

13. The device of claim 8, the H-matrix configured to generate at least nine (9) check bits for a data word with 32<data bits <=64.

14. The device of claim 8, the H-matrix configured to generate at least twelve (12) check bits for a data word with 32<data bits <=64.

15. A memory system, comprising:
  a memory controller configured to provide a data word to encoding logic;
  the encoding logic configured to generate an encoding of the data word in conformance with a G-matrix corresponding to a decoding H-matrix having the following properties:
  (a) no all 0 columns;
  (b) all columns are distinct;
  (c) no linear dependency involving three or less columns;
  (d) no linear dependency involving columns $C_i, C_j, C_k, C_m$, where m>k>j>i, such that j=i+1 and m=k+1; and
  (e) no linear dependency involving columns $C_i, C_j, C_k, C_m$, where m>k>j>i, where m>k>j>i, where (j=i+1 and m-k=q) or (k=j+1 and m-i=q) or (m=k+1 and j-i=q) for all integer values of q such that q>1 and q<=d, where d>=2 and d<=n-1 where n-k is a number of check bits for the data word; and
  the memory controller configured to provide the encoding of the data word to decoding logic based on the H-matrix.

16. The memory system of claim 15, further comprising:
  the decoding logic comprising syndrome detection logic to detect matches of any n−1 adjacent double error syndromes for the encoding of the data word, and upon detecting a match to output an indication of a double adjacent error and corresponding bit positions of the double adjacent error.

17. The memory system of claim 15, the H-matrix configured to apply at least six (6) check bits to a 16-bit data word.

18. The memory system of claim 15, the H-matrix configured to apply at least seven (7) check bits to a data word with 16<data bits <=32.

19. The memory system of claim 15, the H-matrix configured to apply at least eight (8) check bits to a data word with 16<data bits <=32.

20. The memory system of claim 15, the H-matrix configured to apply at least eight (8) check bits to a data word with 32<data bits <=64.

* * * * *